(12) United States Patent
Shimada et al.

(10) Patent No.: US 11,275,505 B2
(45) Date of Patent: Mar. 15, 2022

(54) STORAGE SYSTEM

(71) Applicant: HITACHI, LTD., Tokyo (JP)

(72) Inventors: Kentaro Shimada, Tokyo (JP);
Nagamasa Mizushima, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 17/021,187

(22) Filed: Sep. 15, 2020

(65) Prior Publication Data
US 2021/0342069 A1    Nov. 4, 2021

(30) Foreign Application Priority Data

Apr. 30, 2020    (JP) .............................. JP2020-080747

(51) Int. Cl.
*G06F 3/06*    (2006.01)

(52) U.S. Cl.
CPC .......... *G06F 3/0607* (2013.01); *G06F 3/0619* (2013.01); *G06F 3/0632* (2013.01); *G06F 3/0679* (2013.01); *G06F 3/0683* (2013.01)

(58) Field of Classification Search
CPC ...... G06F 3/0608; G06F 3/0638; G06F 3/064; G06F 3/061; G06F 3/0659; G06F 3/0661; G06F 3/067; G06F 3/0679; G06F 12/00; G06F 12/0246; G06F 12/04; G06F 16/22; G06F 16/2365; G06F 2212/401; G06F 2212/7204; G06F 3/06; G06F 3/0629; G06F 3/0634; G06F 3/0656; G06F 3/0688; G06F 3/0689

See application file for complete search history.

(56) References Cited

U.S. PATENT DOCUMENTS

| | | | |
|---|---|---|---|
| 9,952,771 B1 | 4/2018 | Bigman | |
| 10,346,043 B2 | 7/2019 | Golden et al. | |
| 2015/0030222 A1* | 1/2015 | Pang ........................ | G06T 9/00 382/131 |
| 2017/0235774 A1 | 8/2017 | Colgrove et al. | |
| 2019/0205035 A1 | 7/2019 | Mizushima et al. | |

* cited by examiner

*Primary Examiner* — Yong J Choe
(74) *Attorney, Agent, or Firm* — Volpe Koenig

(57) ABSTRACT

A data compression system in a storage system compresses data with a first compression method to generate compressed data, determines whether a compression rate of the compressed data is better than a predetermined reference, outputs data obtained by compressing the data by the compression method having a better compression rate than that of the other compression method of the first compression method and a second compression method when it is determined that the compression rate is better than the reference, and outputs data obtained by compressing the data by the compression method having a worse compression rate than that of the other compression method of the first compression method and the second compression method when it is determined that the compression rate is equal to or worse than the reference.

11 Claims, 11 Drawing Sheets

STORAGE SYSTEM

CLAIM OF PRIORITY

The present application claims priority from Japanese patent application JP 2020-80747, filed on Apr. 30, 2020, the content of which is hereby incorporated by reference into this application.

BACKGROUND OF THE INVENTION

1. Field of the Invention

The present invention relates to data compression in a storage system.

2. Description of the Related Art

In a storage system, a technique for compressing data is drawing attention as an important technique for reducing the cost per unit capacity (bit cost) of a system. In particular, in place of a hard disk drive (HDD) that has been used as a conventional storage device, a semiconductor drive (Solid State Drive: SSD) that uses a flash memory with high speed as a medium has been widely used in recent years. The data compression technology has received a great deal of attention as a technology that reduces the bit cost of storage systems equipped with SSDs.

On the other hand, in the storage system, the performance of storing data, that is, the write performance of writing data to the storage system is also important, but the performance of extracting the stored data, that is, the read performance of reading data from the storage system is also very important. If data is compressed when it is stored, it obviously affects the write performance. After that, since the data is stored in a compressed state, it is necessary to restore (decompress) the compressed data when extracting the data, and the read performance is also affected.

Various variations have been devised as a calculation method (algorithm) for compressing data. There are lossless compression methods such as Lempel-Ziv (LZ) method and Huffman code, and lossy compression methods such as JPEG and MPEG used for images and audio. Since the storage system is required to accurately extract the same data as the stored data, the lossless compression method is used.

In these compression methods, the ratio of the size of the compressed data to the size of the original data, that is, the compression rate varies depending on data and algorithms. The compression rate for the same data differs depending on algorithms, but the compression rate differs for different data even with the same algorithm.

In addition to the compression rate, the calculation processing amount required for compression and the calculation processing amount required for decompression also vary. Therefore, the time required for compression (compression time) and the time required for decompression (decompression time) when the calculation processing resources such as a software processing by the CPU and a hardware circuit for compression and decompression also vary. The affection on the write performance of the storage system depends on this compression time, and the affection on the read performance depends on the decompression time.

US 2019/0,205,035 A discloses a technique of switching the compression algorithms provided in the compression circuit in the SSD depending on the access performance of the flash memory when the compression circuit has two kinds of compression algorithms in a storage system. In addition, U.S. Pat. No. 10,346,043 discloses a technique in which a plurality of compression algorithms are prepared, and the decompression time is predicted from the past history for each data block to switch the compression algorithms. With these techniques, the compression algorithm can be switched so as to improve the read performance and the write performance of the storage system.

Further, U.S. Pat. No. 9,952,771 discloses a technique in which data is temporarily compressed by a compression algorithm and stored in a storage system by executing a write command, the data is compressed by another compression algorithm, and the write command is performed again according to a score weighted by the compression rate. Further, US 2017/0,235,774 A discloses a technique in which the compression rate by all selectable compression algorithms of input data is obtained, and the compression algorithm is selected from the compression rate and the decompression speed according to a calculation amount and a capacity available in the storage system.

However, in the techniques of US 2019/0,205,035 A and U.S. Pat. No. 10,346,043, the compression algorithm varies depending on the performance, and the compression rate also varies. Even for data with a high compression rate, the compression algorithm may vary and the compression rate may decrease. Further, in the technique of US 2019/0,205,035 A, since the compression algorithm is selected based on the compression speed (compression time) and the access performance of the flash memory, it is not possible to consider the decompression time that greatly affects the read performance of the storage system.

Further, since the technique of U.S. Pat. No. 10,346,043 is based on the prediction of the decompression performance (decompression time) based on the past history, it cannot make a prediction when the decompression time different from the past history is obtained from the current data. Further, in the technique of U.S. Pat. No. 9,952,771, regardless of the decompression time, the data once compressed by one compression algorithm is recompressed by another compression algorithm. Therefore, it is not possible to consider that the decompression time that greatly affects the read performance of the storage system.

In the technique of US 2017/0,235,774 A, all compression algorithms for which compression rates and decompression speeds can be selected are obtained, and a compression algorithm is selected by complicated processing such as considering the calculation amount and the capacity available in the storage system. Therefore, the overhead of the selection process is large.

Further, US 2017/0,235,774 A does not disclose a technique for reducing the overhead of this selection processing by utilizing the relationship between the compression rate and the decompression speed. For the compression rate and decompression speed, an algorithm with a poor compression rate (large as a numerical value) is selected to increase the decompression speed, and an algorithm with a good compression rate (small as a numerical value) is selected if the decompression speed is not needed to increase. When trying to increase the decompression speed (when trying to reduce the decompression time), the compression rate is always poor because the algorithm with a poor compression rate (large as a numerical value) is selected.

SUMMARY OF THE INVENTION

Considering a decompression time that affects a read performance and a decompression performance that determines this out of the performance of the storage system, generally, in a storage system, the speed at which desired compressed data is read from a storage device such as an SSD depends on the number of SSDs and an SSD access method in the storage system, so a certain speed is expected regardless of the compressed data and the compression rate.

Looking at the decompression performance in terms of the amount of decompressed data per unit time, when the compression rate is good (small as a numerical value), the decompressed data size will expand according to the compression rate, so the decompression performance will increase. Therefore, the data having a good compression rate has high decompression performance, and a read performance of the system can be improved.

From the above, when a plurality of compression algorithms are prepared and selected, a compression algorithm with a good compression rate (small as a numerical value) often requires a long decompression time, but if the compression rate is sufficiently good (small as a numerical value), the decompression speed (decompression performance) measured by the amount of the decompressed data per unit time may be kept high. However, when the compression rate is poor (large as a numerical value), it is difficult to keep the decompression speed (decompression performance) measured by the amount of the decompressed data per unit time high, which may affect the read performance of the storage system.

The invention has been made in view of the above viewpoints, and an object thereof is to suppress the affection on the read performance of a storage system when compressing and storing the data in the storage system.

The outline of typical aspects of the invention disclosed in the present application will be briefly described as follows. The storage system includes a front-end interface that communicates with a host, and a data compression system that compresses the data that the front-end interface receives from the host before storing the data on a storage drive. The data compression system compresses data with a first compression method to generate compressed data, determines whether a compression rate of the compressed data by the first compression method is better than a predetermined reference, outputs data obtained by compressing the data by the compression method having a better compression rate than that of the other compression method of the first compression method and the second compression method when it is determined that the compression rate of the compressed data by the first compression method is better than the reference, and outputs data obtained by compressing the data by the compression method having a worse compression rate than that of the other compression method of the first compression method and the second compression method when it is determined that the compression rate of the compressed data by the first compression method is equal to or worse than the reference.

A data compression system according to another aspect of the invention includes a compression unit that is capable of compressing data by a first compression method and a second compression method, a determination unit that determines whether the compression rate of the data compressed by the first compression method is better than a predetermined reference, and an output unit that outputs the data compressed by the compression unit. When the determination unit determines that the compression rate of the data compressed by the first compression method is better than the reference, the output unit outputs data obtained by compressing the data by the compression method having a better compression rate than that of the other compression method of the first compression method and the second compression method. When the determination unit determines that the compression rate of the data compressed by the first compression method is equal to or worse than the reference, the output unit outputs data obtained by compressing the data by the compression method having a worse compression rate than that of the other compression method of the first compression method and the second compression method.

According to one aspect of the invention, when compressing and storing data in a storage system, it is possible to suppress the affection on a read performance of a storage system.

DESCRIPTION OF THE PREFERRED EMBODIMENTS

Figure 1:
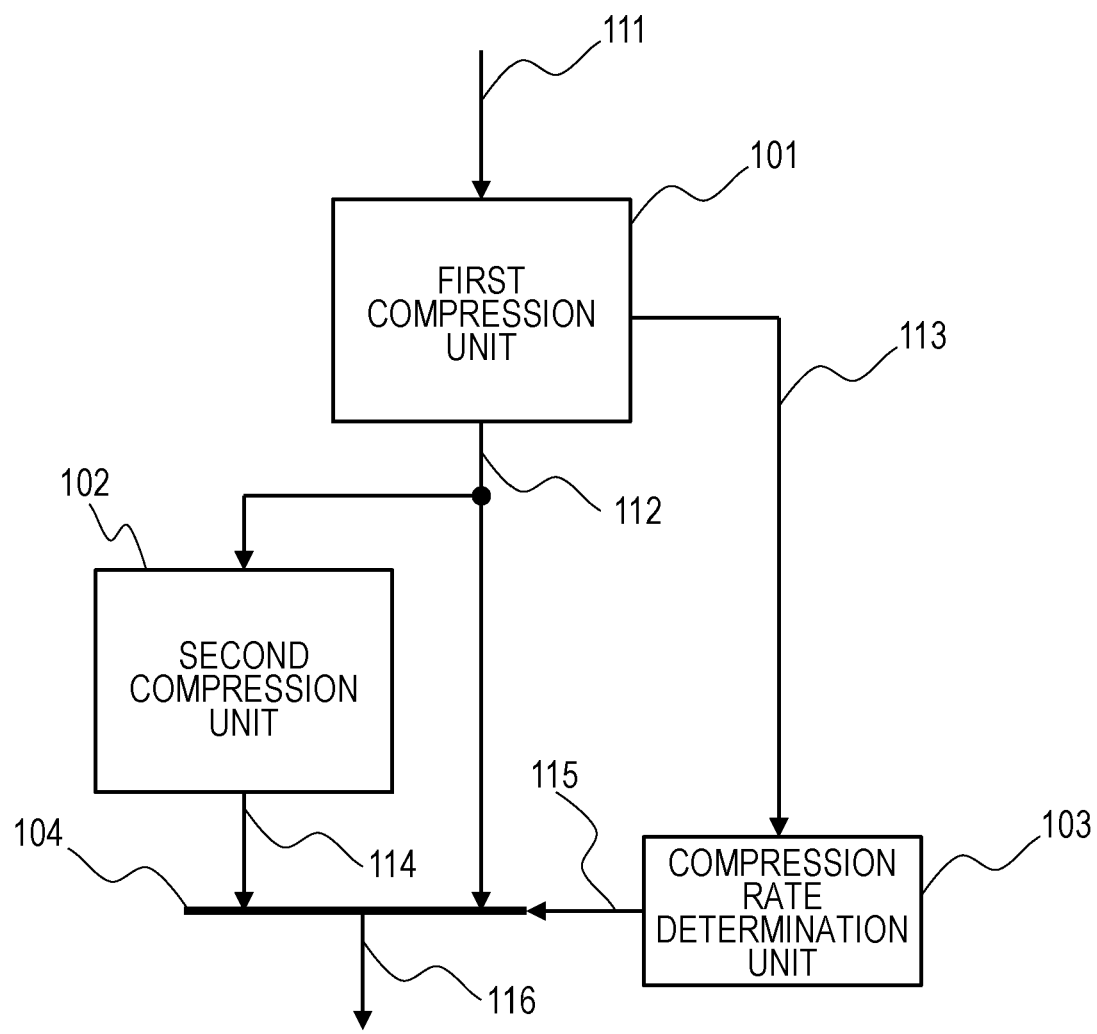
FIG. 1 is an example of a data compression system that compresses data according to a first embodiment.

Hereinafter, some embodiments of the invention will be described with reference to the drawings. Data compression and decompression in a storage system will be described below. The data compression system described below is capable of data compression by two data compression methods, and outputs data compressed by the selected compression method.

Looking at the decompression performance in terms of the amount of decompressed data per unit time, when the compression rate is good (small as a numerical value), the decompressed data size will expand according to the compression rate, so the decompression performance will increase. Therefore, the data having a good compression rate has high decompression performance, and a read performance of the storage system can be improved.

When a plurality of compression algorithms are prepared and selected, a compression algorithm with a good compression rate (small as a numerical value) often requires a long decompression time, but if the compression rate is sufficiently good (small as a numerical value), the decompression speed (decompression performance) measured by the decompressed data can be kept high. However, when the compression rate is poor (large as a numerical value), it is difficult to keep the decompression speed (decompression performance) measured by the decompressed data high, which may affect the read performance of the storage system.

To reduce the affection on the read performance by using this relationship between the compression rate and the decompression time, when selecting a compression method to be used from a plurality of compression methods, if the compression rate and the decompression time according to all of the algorithms of the compression methods are definitely determined with respect to data, it is possible to select the compression method by measuring the compression rate according to the one algorithm of the compression method among all of them. Therefore, in such a case, it is possible to reduce the overhead of the selection process.

As another example, a certain compression method may be divided into the first half and the latter half. In that case, compared to the compression rate and the decompression time when only the first half (first compression method) is applied, the compression rate is ordinarily improved and the decompression time is increased when both the first half and the latter half (second compression method) are applied.

One example of such a compression algorithm is Lempel-Ziv-Markov chain-Algorithm (LZMA). The first half of LZMA is an improved LZ method, and the latter half is configured by entropy coding. The compression rate is often 50 to 80% of the overall effect obtained by the LZ method in the first half. On the other hand, the decompression is time-consuming because the amount of calculation in the latter half of entropy coding is large.

Therefore, observing the compression rate of the LZ method in the first half, if the compression rate is good (small as a numerical value), the decompression speed will increase due to the compression rate even if entropy coding in the latter half is performed, which does not much affect the read performance of the system. However, if the compression rate by the LZ method in the first half is poor (large as a numerical value), the time required for decoding the entropy coding in the latter half cannot be cancelled, and the read performance of the system may deteriorate.

Figure 11:
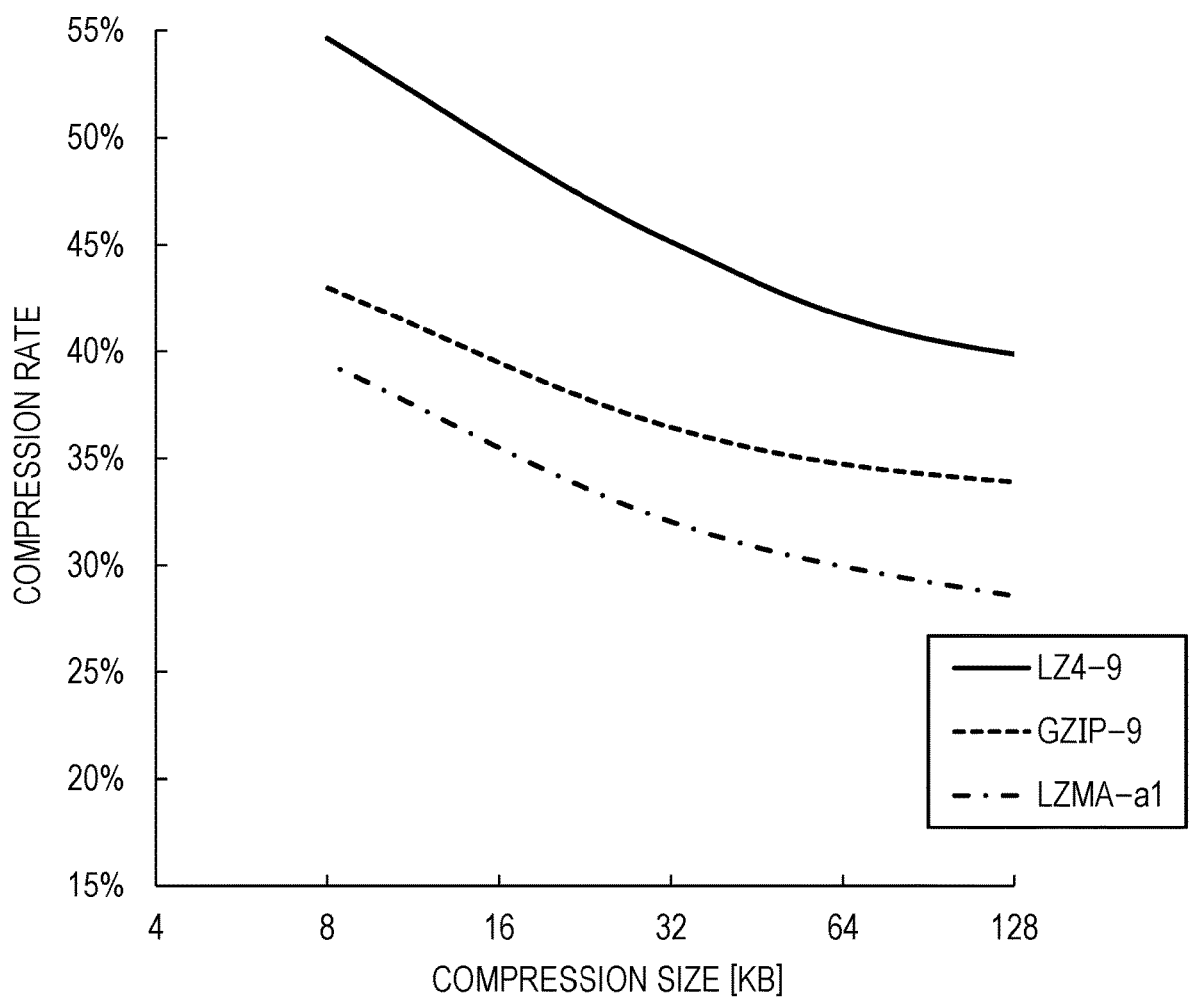
FIG. 11 is an example of observing changes in compression rate when a compression size is changed for three algorithms LZ4, GZIP, and LZMA.

As another example, if the large amount of data is compressed for a certain algorithm, the compression rate improves (small as a numerical value). For example, FIG. 11 is an example of observing changes in the compression rate for three algorithms LZ4, GZIP, and LZMA while changing the size of the data to be compressed. By increasing the size of the data to be compressed, the compression rate becomes good (small as a numerical value) with the all of the algorithms.

On the other hand, if the size of the data to be compressed is increased, generally the decompression time for restoring to the original data also increases. Therefore, even if the size of the data to be compressed is large, if the compression rate is sufficiently good (if the value is small enough), the decompression time can be shortened to some extent, but if the compression rate is poor (if the value is large), it is difficult to shorten the decompression time. Therefore, it may reduce the read performance of the system.

Based on the above viewpoint, the data compression system described below compresses data by a first compression method and determines whether the compression rate is better than a predetermined reference. When it is determined that the compression rate by the first compression method is better than the reference, the data compression system outputs the data compressed by the compression method having a better compression rate than that of the other compression method of the first compression method and the second compression method. When it is determined that the compression rate by the first compression method is equal to or worse than the reference, the data compression system outputs the data compressed by the compression method having a worse compression rate than that of the other compression method of the first compression method and the second compression method.

When the compression rate is good, the affection of the decompression time can be suppressed even if the decompression time is increased, so there is no need to reduce the compression rate, and even when the compression rate is poor, the decompression time can be shortened by selecting the compression method of the poorer compression rate but the better decompression performance. Further, it is possible to consider the decompression time that has a great affection on the read performance of the storage system. Further, since the determination is made based on the current data compression rate, it is possible to cope with the decompression time different from the past history.

First Embodiment

A first embodiment will be described with reference to FIGS. 1 to 4. FIG. 1 is an example of the configuration of a data compression system according to the first embodiment. In FIG. 1, the data compression system includes a first compression unit 101, a second compression unit 102, a compression rate determination unit 103, a data selection unit 104, and six signal lines 111 to 116. The first compression unit 101 and the second compression unit 102 are included in the compression part of the data compression system, and the data selection unit 104 is an output part that outputs data.

The first compression unit 101 compresses the data input from outside the data compression system via the input signal line 111 using the first compression algorithm, and outputs the compressed data to the signal line 112.

These signal lines 111 and 112 may be serial transmission lines that transmit data in a series of signal patterns or parallel transmission lines that transmit a plurality of data bits in parallel. In addition, transmission control may be performed by transmitting a control signal for controlling signal transmission timing through a sideband control signal line (not illustrated in FIG. 1), or data and control signals may be transmitted through the same signal line. Further, for data transmission, the data may be divided into a plurality of packets and transmitted packet by packet, or the signal line may be occupied at a constant timing and the data may be transmitted at an arbitrary timing.

Further, the first compression unit 101 outputs the compression rate (the rate of the size of compressed data to the size of data before compression) of the data input through the input signal line 111 to the signal line 113 according to the first compression algorithm. This signal line 113 may also be a serial transmission line or a parallel transmission line. The signal indicating the compression rate may not be a digital signal but an analog signal transmitted at a voltage level or the like. Further, while not illustrated in FIG. 1, a sideband signal line related to signal transmission control may be provided, or the same signal line may be used to transmit the data of the compression rate and the control signal.

The second compression unit 102 further compresses the data which is compressed by the first compression unit 101 and output to the signal line 112, by a second compression algorithm different from the first compression algorithm, and outputs the data to the signal line 114.

The compression rate determination unit 103 causes the data selection unit 104 to select the compressed data to be output by the select signal line 115, using the compression rate information in the first compression unit 101 input from the signal line 113. Specifically, when the compression rate in the first compression unit 101 is better than a predetermined threshold (as a numerical value, the rate of the size of the compressed data to the size of the data before compression is smaller than a predetermined threshold), the compression rate determination unit 103 causes the compressed data by the second compression unit 102 transmitted by the signal line 114 to be selected. On the other hand, when the compression rate in the first compression unit 101 is equal to or worse than a predetermined threshold (as a numerical value, the rate of the size of compressed data to the size of data before compression is larger than a predetermined threshold), the compression rate determination unit 103 causes the compressed data in the first compression unit 101 transmitted by the signal line 112 to be output.

The data selection unit 104 selects the data designated by the compression rate determination unit 103 by the select signal line 115, and outputs the data to the output signal line 116.

Like the signal lines 111 and 112, these signal lines 114 and 116 may be serial transmission lines or parallel transmission lines. The control signal for signal transmission control may be transmitted through a sideband control signal line (not illustrated in FIG. 1), or the data and the control signal may be transmitted through the same signal line.

Further, the data may be transmitted by multiple packets, or the signal line may be occupied at a constant timing to arbitrarily transmit the data. Further, the select signal line 115 may show the selection result with a voltage level, or may show the selection result with a pulsed signal at a constant timing. Further, a control line (not illustrated in FIG. 1) may be used to instruct the data selection unit 104 with a timing to select data from the compression rate determination unit 103 and a timing to output data to the signal line 116. A signal for controlling a timing to select data and a timing to output data may be generated in the data selection unit 104.

For example, the first compression unit 101 may transmit the compressed data to the second compression unit 102 in response to the instruction from the compression rate determination unit 103. The compression rate determination unit 103 instructs the first compression unit 101 to transmit the compressed data to the second compression unit 102 when the compression rate in the first compression unit 101 is better than a predetermined threshold. As a result, unnecessary compression processing by the second compression unit 102 can be omitted when the compression rate in the first compression unit 101 is poor. With the configuration illustrated in FIG. 1, when the compression rate compressed by the first compression unit 101 is good (small as a numerical value), the data is further compressed by the second compression unit 102. However, since the decompressed data is expanded in size by the compression rate of the first compression unit 101 when decompressing the data, the time for decompressing the data can be relatively short.

Further, when the compression rate compressed by the first compression unit 101 is poor (large as a numerical value), data without compression by the second compression unit 102 can be output, so when decompressing the data, only the compression of the data by the first compression unit 101 needs to be decompressed, and the time for decompressing the data can be shortened.

Figure 2:
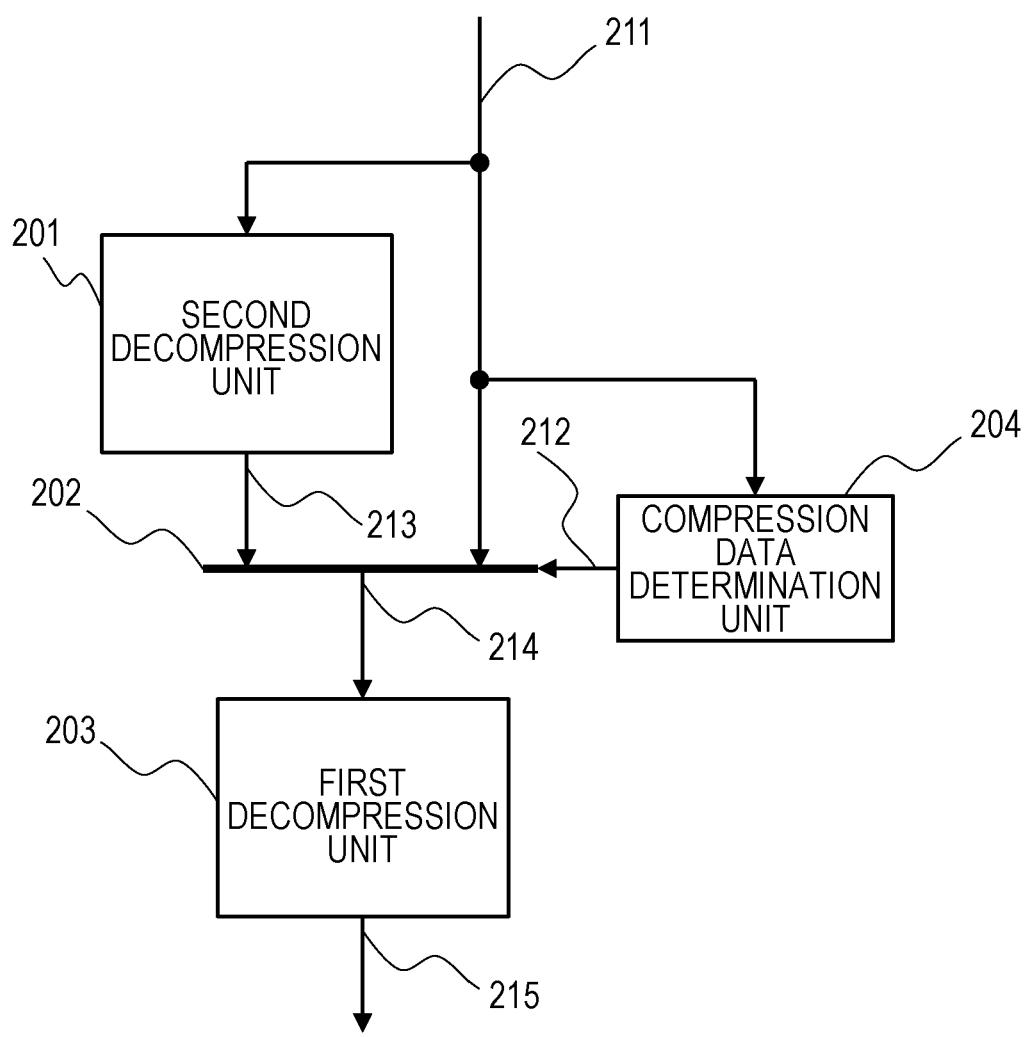
FIG. 2 is a portion of the data compression system that decompresses the compressed data resulting from the data compression of the first embodiment.

FIG. 2 illustrates an example of a data decompression system that can be added to the data compression system of FIG. 1 to restore compressed data to original data. In FIG. 2, the data decompression unit includes a first decompression unit 203, a second decompression unit 201, a compressed data determination unit 204, a data selection unit 202, and five signal lines 211 through 215.

The first decompression unit 203 restores the data compressed by the first compression algorithm used by the first compression unit 101 in FIG. 1. The second decompression unit 201 decompresses the data with a second decompression algorithm different from the first decompression algorithm. The second decompression unit 201 decompresses the data compressed by the second compression algorithm used by the second compression unit 102 in FIG. 1. The compression data determination unit 204 determines whether the compressed data input to the data decompression system is the data compressed by the first compression unit 101 in FIG. 1 or the data compressed by the second compression unit 102 in FIG. 1.

The second decompression unit 201 decompresses the compressed data input by the input signal line 211 and the data compressed by the second compression algorithm used by the second compression unit 102 in FIG. 1 using the second decompression algorithm, and outputs the decompressed data to the signal line 213.

As the compressed data input to the input signal line 211, the compressed data output of the compressed data output signal line 116 of the data compression system illustrated in FIG. 1 may be input as it is. Alternatively, it is considered that a compressed data storage unit (not illustrated in FIGS. 1 and 2) inside the data compression system is provided to temporarily accumulate the compressed data output to the signal line 116 of FIG. 1 in the compressed data storage unit, and the compressed data is input to the signal line 211. By doing so, for example, by comparing the decompressed data output by the data decompression system illustrated in FIG. 2 with the original data before compression, it is possible to verify whether the data compression system illustrated in FIG. 1 correctly compresses data. Further, it can be considered that the compressed data is once output to the outside of the data compression system, and then input to the input signal line 211 again from the outside of the data decompression system.

The compressed data determination unit 204 determines whether the compressed data input to the input signal line 211 is the data compressed by the first compression unit 101 of FIG. 1 or the data compressed by the second compression unit 102, and outputs the determination result to the data select signal line 212.

For example, based on the data included in the compressed data, the compressed data determination unit 204 determines whether the compressed data is compressed by the first compression algorithm used in the first compression unit 101 or is compressed by the second compression algorithm used in the second compression unit 102. The result of the determination is output to the data select signal line 212. For example, when the format of the compressed data by the first algorithm and/or the second algorithm always includes predetermined data (value), the predetermined data can be used to identify the compression algorithm.

In another example, marker information indicating the compressed data by the first compression unit 101 or the compressed data by the second compression unit 102 may be added to the compressed data. This marker information may be added to each compressed data output in the first compression unit 101 and the second compression unit 102 in FIG. 1, or may be added in the data selection unit 104. Further, the data selection unit 104 may transmit the marker information to the compressed data determination unit 204 via a marker information signal line (not illustrated in FIGS. 1 and 2).

Furthermore, when the data compression system is provided with a compressed data storage unit (not illustrated in FIGS. 1 and 2), the marker information may be added to the compressed data and accumulated in the same manner as the compressed data. When the compressed data is once output to the outside of the data compression system and then the compressed data is input to the signal line 211 from the outside of the data decompression system, the marker information is added to the compressed data and once output to the outside of the data compression system together with the compressed data, and then the marker information and the compressed data may be input together from the outside of the data decompression system via the signal line 211.

When there is such marker information, the compressed data determination unit 204 need only receive the marker information, and need not receive the compressed data itself. Further, the compression method may be identified in the data format of the entire compressed data so that it may be determined whether the compressed data by the first compression unit 101 or the compressed data by the second compression unit 102.

For example, the second decompression unit 201 may decompress the input compressed data in response to the instruction from the compressed data determination unit 204. The compressed data determination unit 204 instructs the second decompression unit 201 to decompress the compressed data when the compressed data is compressed by the second compression unit 102. As a result, correct decompression is possible and unnecessary decompression processing can be omitted.

The data selection unit 202 selects the signal line 211 or the signal line 213 according to the determination result output from the compressed data determination unit 204 to the data select signal line 212. Specifically, when it is determined that the compressed data input to the signal line 211 is the data compressed by the first compression unit 101, the compressed data input to the signal line 211 is selected. When it is determined that the compressed data input to the signal line 211 is the data compressed by the second compression unit 102, the decompressed data that is decompressed by the second decompression unit 201 and output to the signal line 213 is selected. The data selection unit 202 outputs the selected data to the data selection output signal line 214.

The data selection unit 202 may further include an input data buffer or the like not illustrated in FIG. 2 when it takes time for the second decompression unit 201 to decompress the data. The data selection unit 202 can temporarily accumulate the compressed data input to the input signal line 211 and the determination result that is determined by the compressed data determination unit 204 and output to the data select signal line 212 in the buffer, and may wait until the decompressed data from the second decompression unit 201 is completely output to the signal line 213.

The first decompression unit 203 decompresses the data output to the data selection output signal line 214 using the first decompression algorithm that restores the data compressed by the first compression algorithm used by the first compression unit 101, and outputs the decompressed data to the output signal line 215.

These signal lines 211, 213, 214, and 215 may be serial transmission lines or parallel transmission lines like the signal lines 111, 112, 114, and 116. The control signal for signal transmission control may be transmitted by a sideband control signal line (not illustrated in FIG. 2), or the data and the control signal may be transmitted by the same signal line.

Further, the data may be transmitted by multiple packets, or the signal line may be occupied at a constant timing to arbitrarily transmit the data. Further, the data select signal line 212 may present the selection result at a voltage level like the select signal line 115, or may present the selection result as a pulsed signal at a constant timing. Further, a control line (not illustrated in FIG. 2) may be used to instruct a timing of selecting data and a timing of outputting data to the signal line 214 to the data selection unit 202 from the compressed data determination unit 204. A signal for controlling the timing of selecting data or the timing of outputting data may be generated inside the data selection unit 202.

When the data decompression system as illustrated in FIG. 2 is added to the data compression system as described before, when the compression rate compressed by the first compression unit 101 is good (small as a numerical value) in the configuration as illustrated in FIG. 1, the data compressed by the first compression unit 101 and the second compression unit 102 can be decompressed correctly. When the compression rate compressed by the first compression unit 101 is poor (large as a numerical value), the compressed data only by the first compression unit 101 can be decompressed correctly while omitting the compression of the data by the second compression unit 102.

Figure 3:
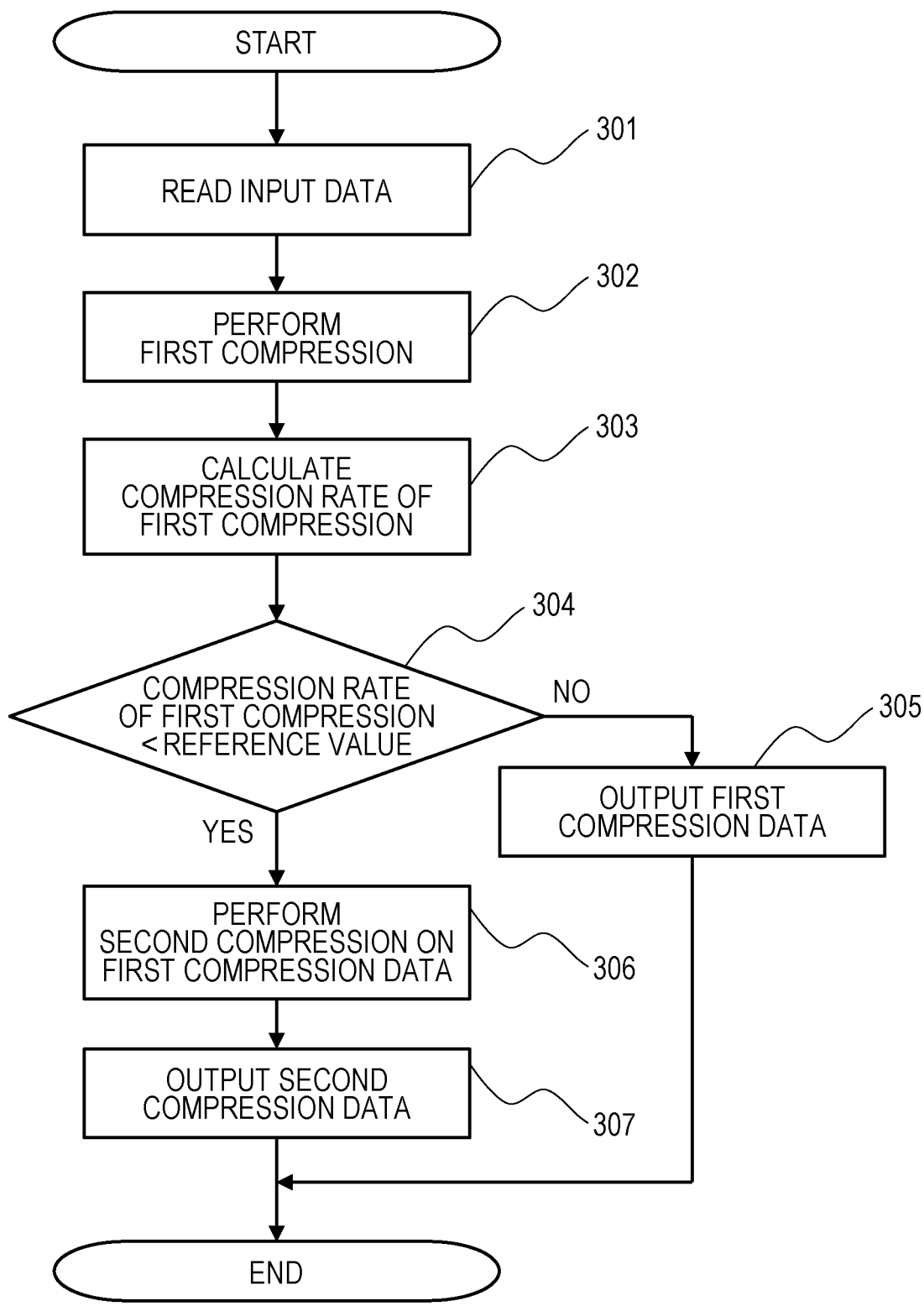
FIG. 3 is an example of a flowchart for compressing data according to the first embodiment.

FIG. 3 illustrates a flowchart of a method for compressing data according to the first embodiment. In FIG. 3, in Step 301, the first compression unit 101 reads the data to be compressed. Next, in Step 302, the first compression unit 101 compresses the input data read in Step 301 using the first compression algorithm. In Step 303, the first compression unit 101 calculates the compression rate based on the compression of the input data in Step 302.

In Step 304, the compression rate determination unit 103 determines whether the compression rate calculated in Step 303 is smaller than a predetermined threshold (compression rate is good). When it is smaller than the predetermined threshold (the compression rate is good) (304: YES), the flow further proceeds to Step 306. The second compression unit 102 further compresses the compressed data compressed by the first compression algorithm in Step 302 by the second compression algorithm. Further, in Step 307, the data selection unit 104 outputs the data compressed by the second compression algorithm.

In Step 304, when the compression rate calculated in Step 303 is larger than the predetermined threshold (poor compression rate) (304: NO), the flow proceeds to Step 305. In Step 305, the data selection unit 104 outputs the data compressed by the first compression algorithm.

As described above, in the data compression system of this embodiment, the first compression method compresses the data by the first compression algorithm, and the second compression method compresses the data by the second compression algorithm after compressing the data by the first compression algorithm.

When the compression rate compressed by the first compression algorithm is good (small as a numerical value) by the above method for compressing data, even if the data is further compressed by the second compression algorithm, the decompressed data will expand by the compression rate of the first compression algorithm at the time of decompressing the data, so the time for decompressing the data can be relatively reduced.

In addition, when the compression rate compressed by the first compression algorithm is poor (large as a numerical value), the compressed data that omits the compression of the data by the second compression algorithm is output. Therefore, it is only necessary to decompress the data by the first compression algorithm at the time of decompressing the data, and the time for decompressing the data can be shortened. Further, only using the compression rate of the first compression algorithm, it is possible to determine whether the compression is performed only by the first compression algorithm or by using the second compression algorithm in addition to the first compression algorithm. The compression rate by the second compression algorithm is not necessary for the determination.

Figure 4:
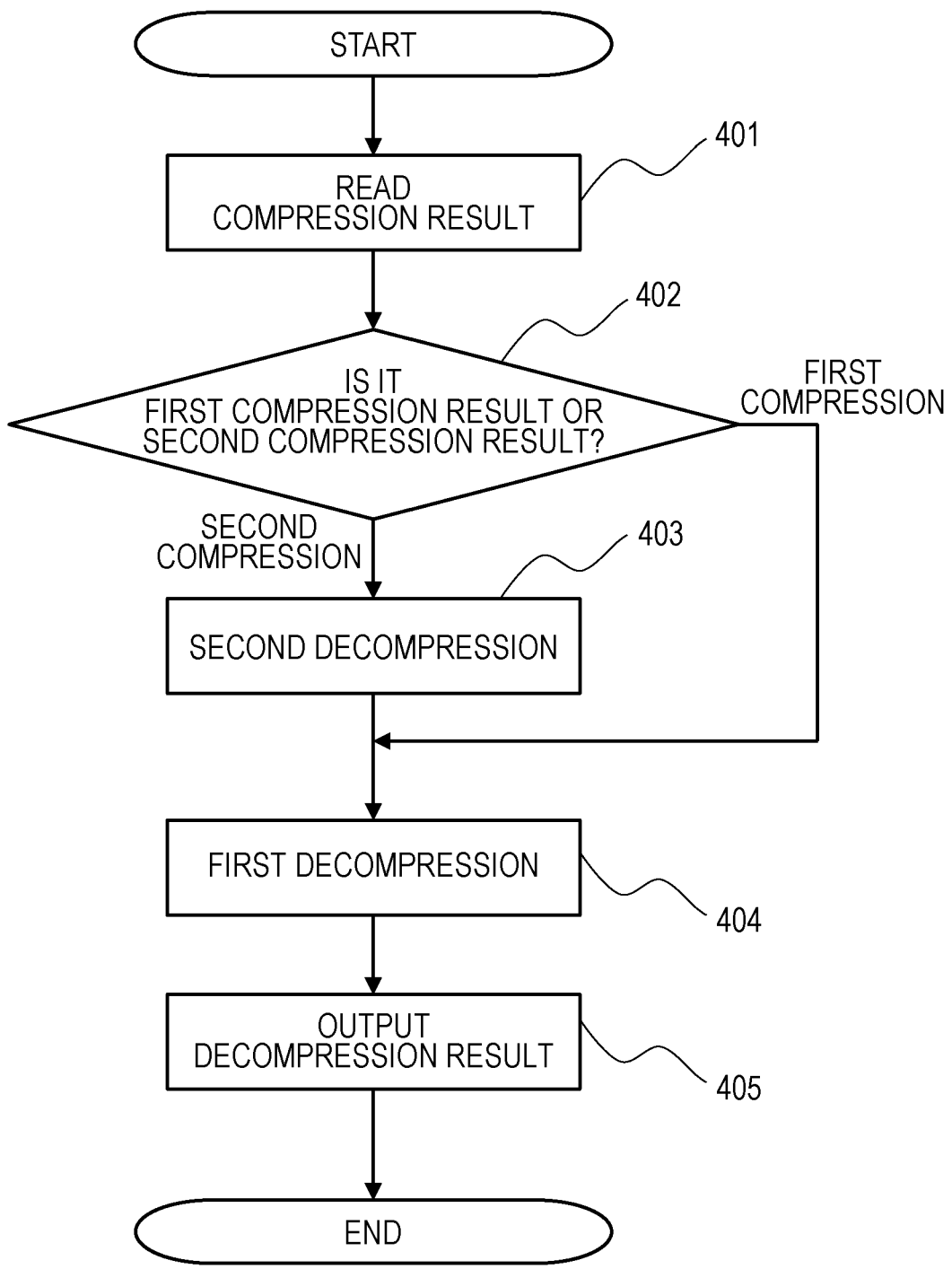
FIG. 4 is an example of a flowchart for decompressing data according to the first embodiment.

FIG. 4 is a flowchart of a data decompression method for restoring the data compressed by the data compression method illustrated in FIG. 3. In FIG. 4, first, in Step 401, the compressed data determination unit 204 receives compressed data. Next, in Step 402, the compressed data determination unit 204 determines whether the received compressed data is the compressed data by the first compression algorithm compressed in Step 302 of FIG. 3 or the second compressed data by the second compression algorithm compressed in Step 306.

In Step 402, for example, based on the data included in the compressed data, it is determine whether the received compressed data is the compressed data by the first compression algorithm used in Step 302 of FIG. 3 or the compressed data by the second compression algorithm used in Step 306. For example, when the format of the compressed data by the first algorithm and/or the second algorithm always includes predetermined data (value), the predetermined data can be used to identify the compression algorithm.

Alternatively, the compression method of the compressed data can be specified by referring to the marker information indicating the compressed data by the first compression unit 101 or the compressed data by the second compression unit 102. The data decompression system specifies either the first compression method or the second compression method based on identification information given to the compressed data, including the data included in the compressed data, the newly added marker information, or the case of being displayed in the data format of the entire compressed data.

When the received data is determined in Step 402 to be the compressed data by the second compression algorithm compressed (402: second compression), the second decompression unit 201 decompresses the received compressed data by the second compression algorithm in Step 403, and restores the data compressed by the first compression algorithm. In Step 404, the first decompression unit 203 decompresses the restored data compressed by the first compression algorithm to restore the original data before compression.

When it is determined in Step 402 that the data is compressed data by the first compression algorithm (402: first compression), Step 403 is skipped. In Step 404, the first decompression unit 203 decompresses the compressed data which is not decompressed by the second decompression unit 201 to restore the original data before compression.

By the method of decompressing the data as illustrated above, when the compression rate compressed by the first compression algorithm in the method of compressing the data as illustrated in FIG. 3 is good (small as a numerical value), the data compressed by the first compression algorithm and the second compression algorithm can be decompressed correctly. Further, when the compression rate compressed by the first compression algorithm is poor (large as a numerical value), the data compressed by the first compression algorithm can be decompressed correctly without compression by the second compression algorithm.

The functional unit, specifically, the compression unit, the compression rate determination unit, the decompression unit, the compressed data determination unit, and the like in the data compression system may be implemented by one or plurality of processors operating according to a program and/or a logic circuit configured to perform a predetermined calculation. This is the same in the other embodiments.

Second Embodiment

Figure 5:
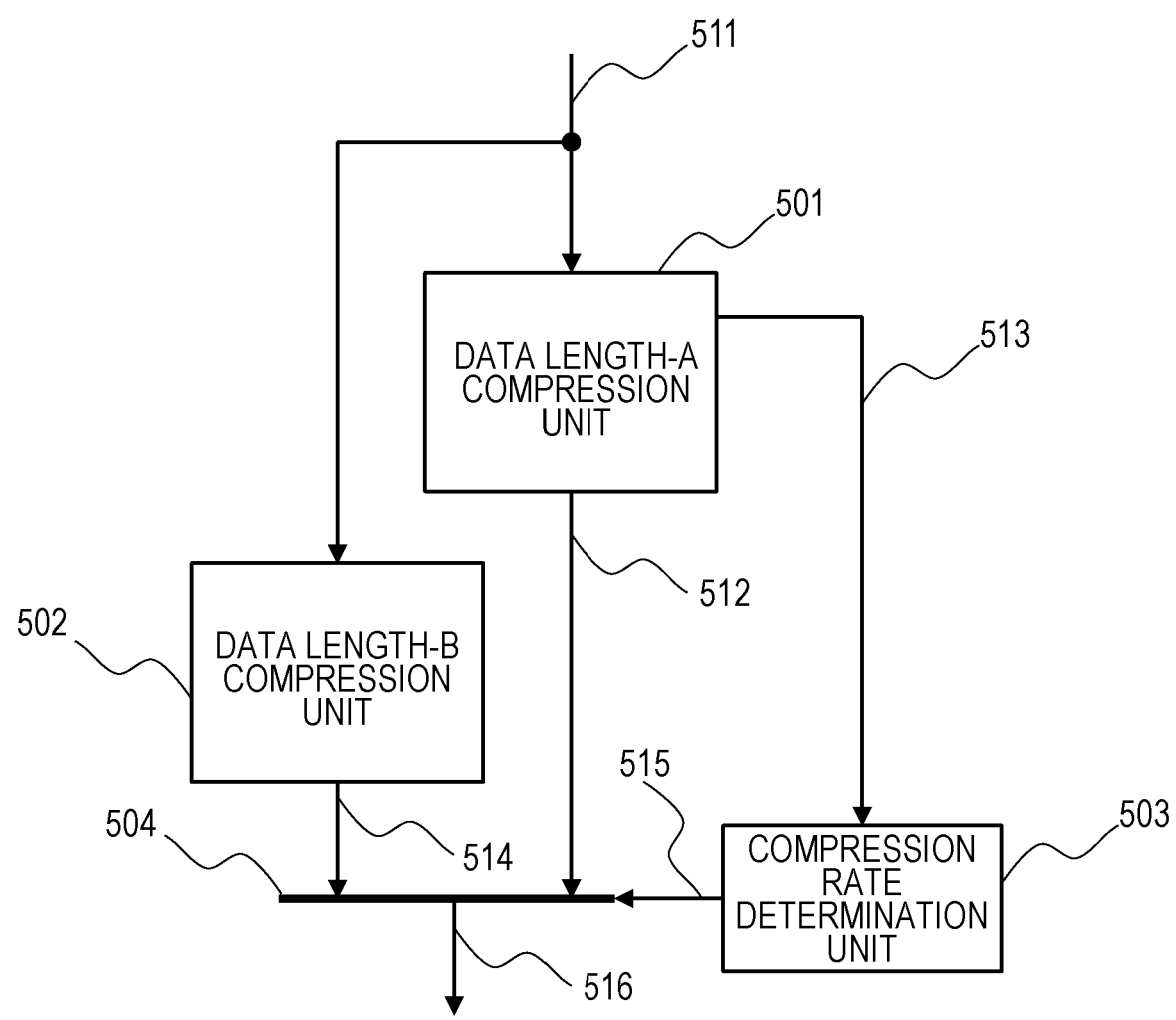
FIG. 5 is an example of a data compression system that compresses data according to a second embodiment.

Next, a second embodiment of the invention will be described with reference to FIGS. 5 and 6. FIG. 5 is an example of the configuration of the data compression system according to the second embodiment. In FIG. 5, the data compression system includes a data length-A compression unit 501, a data length-B compression unit 502, a compression rate determination unit 503, a data selection unit 504, and six types of signal lines 511 to 516. The data length-A compression unit 501 and the data length-B compression unit 502 are included in the data compression part of the data compression system, and the data selection unit 504 is included in the output part that outputs the data.

The data length-A compression unit 501 divides the data input through the input signal line 511 into predetermined data lengths A to generate a plurality of segments, and compresses each segment by a predetermined compression algorithm. The compressed data resulting from the compression is output to the output signal line 512. Further, the data length-A compression unit 501 transmits the information of the compression rate of the compression result to the compression rate determination unit 503 through the signal line 513.

The data length-B compression unit 502 divides the data input by the input signal line 511 into predetermined segments for each data length B which is shorter than the data length A to generate a plurality of segments. Each segment is compressed using the same compression algorithm as that of the data length-A compression unit 501. Accordingly, it is expected that the decompression time of the compressed data by the data length-B compression unit 502 is shorter than the decompression time of the compressed data by the data length-A compression unit 501 when the compression rate by the data length-A compression unit 501 is poor (numerically large).

The compression rate determination unit 503 receives information on the compression rate of the compression result by the data length-A compression unit 501 via the signal line 513, and outputs a select instruction signal for the data selection unit 504 through the select signal line 515 to select the compressed data by the data length-A compression unit 501 if the compression rate of the compression result of the data length-A compression unit 501 is better than a predetermined threshold.

If the compression rate of the compression result of the data length-A compression unit 501 is equal to or worse (larger as a numerical value) than the predetermined threshold, the compression rate determination unit 503 outputs the select instruction signal for the data selection unit 504 through the select signal line 515 to select the compressed data by the data length-B compression unit 502. In accordance with the select instruction signal output from the compression rate determination unit 503 through the data select signal line 515, the data selection unit 504 selects the compressed data output from the output signal line 512 of the data length-A compression unit 501 or the compressed data output from the output signal line 514 of the data length-B compression unit 502, and outputs the data to the output signal line 516.

By selecting the compression method as described above, the affection on the read performance can be reduced while using high data compression rate. Even if the compression rate by the data length-A compression unit 501 is good, the decompression time of the compressed data by the data length-B compression unit 502 may be shorter than the decompression time of the compressed data by the data length-A compression unit 501. A high data compression rate can be utilized in a small range in which the affection on the read performance is allowed.

For example, the data length-B compression unit 502 may compress the input data in response to the instruction from the compression rate determination unit 503. The compression rate determination unit 503 instructs the data length-B compression unit 502 to perform compression when the compression rate in the data length-A compression unit 501 is equal to or worse than the predetermined threshold. As a result, unnecessary compression processing by the data length-B compression unit 502 can be omitted when the compression rate in the first compression unit 501 is good.

The signal lines 511, 512, 514, and 516 may be serial transmission lines or parallel transmission lines, like the signal lines 111 and 112 in FIG. 1 of the first embodiment. The control signal for signal transmission control may be transmitted through a sideband control signal line (not illustrated in FIG. 5), or the data and the control signal may be transmitted through the same signal line. Further, the data may be transmitted by multiple packets, or the signal line may be occupied at a constant timing to arbitrarily transmit the data.

Further, the signal line 513 to which the information of the compression rate of the compression result by the data length-A compression unit 501 is output may be a serial transmission line or a parallel transmission line like the signal line 113 of FIG. 1 in the first embodiment. Alternatively, an analog signal transmitted at a voltage level or the like may be used instead of the digital signal.

Further, a sideband signal line (not illustrated in FIG. 5) related to signal transmission control may be separately provided, or the same signal line may be used to transmit the compression rate information and the control signal. Further, the data select signal line 515 may present the selection result at a voltage level like the select signal line 115 of FIG. 1 of the first embodiment, or may present the selection result as a pulsed signal at a constant timing.

Further, a control line (not illustrated in FIG. 5) may be used to instruct a timing of selecting the compressed data and a timing of outputting the compressed data to the signal line 516 to the data selection unit 504 from the compression rate determination unit 503. A signal for controlling the timing of selecting the compressed data or the timing of outputting the compressed data may be generated inside the data selection unit 504.

As described above, in the second embodiment, if the compression rate is good (small as a numerical value) when compressed by the long data length A by the data length-A compression unit 501, the decompression time is shortened by the good compression rate. Therefore, the result compressed with the data length A is employed. On the other hand, if the compression rate is poor (large as a numerical value) when compressed with the long data length A, the result of compression with the short data length B is employed. This makes it possible to avoid an extra increase in decompression time caused by compressing a long data length with a poor (large as a numerical value) compression rate.

Further, in general, when compressing with the same algorithm, it is known that the compression rate with the long data length A and the compression rate with the short data length B have a characteristics that the compression rate with the long data length A is better (small as a numerical value). FIG. 11 illustrates the characteristics of the three algorithms LZ4, GZIP, and LZMA. Therefore, by utilizing the general characteristics of this compression algorithm, it is possible to determine whether to compress with the long data length A or the short data length B only by obtaining the compression rate with the long data length A. It is not necessary to obtain the compression rate with the short data length B in order to determine which data length is used for compression.

Figure 6:
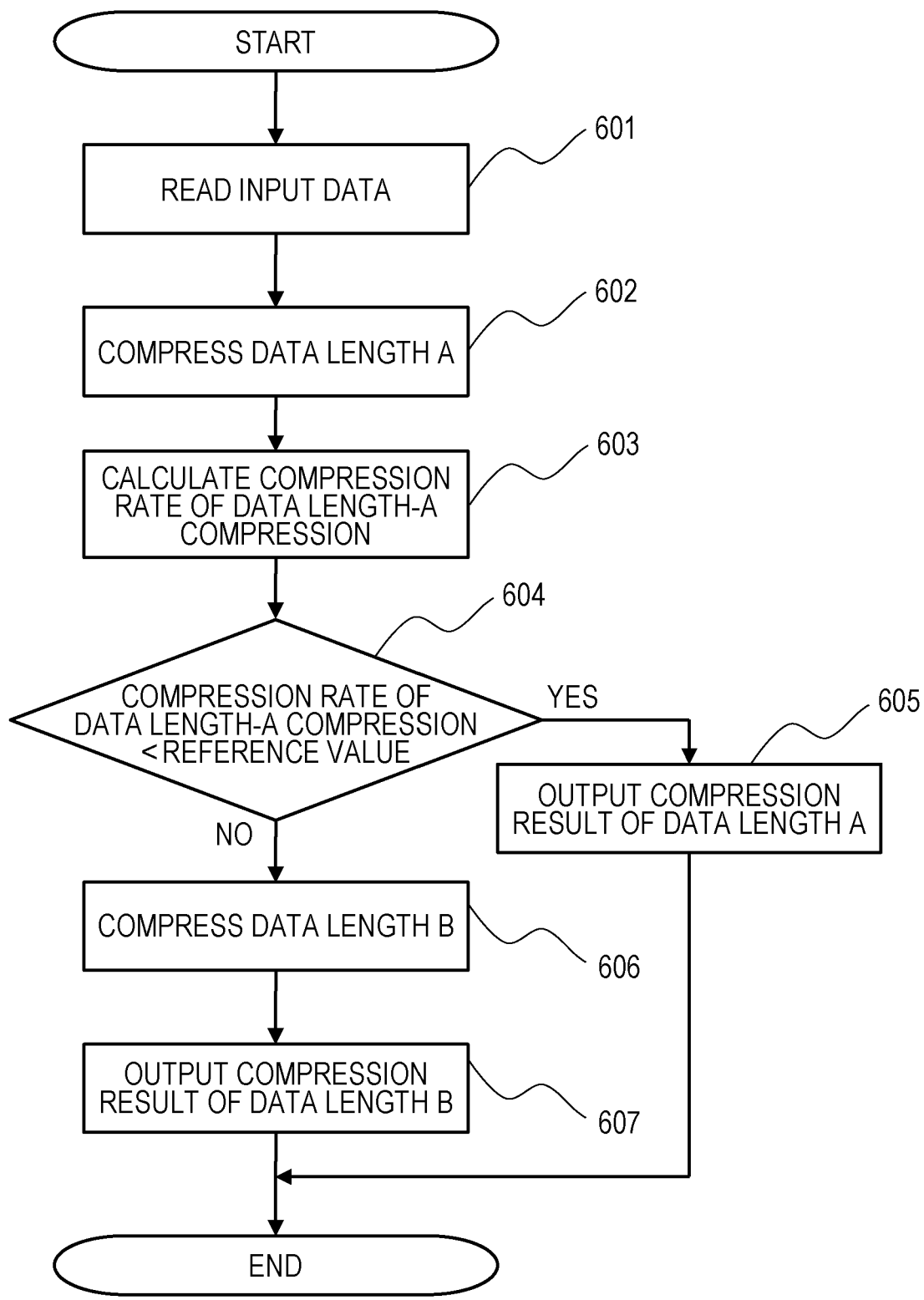
FIG. 6 is an example of a flowchart for compressing data according to the second embodiment.

FIG. 6 illustrates a flowchart of a method for compressing data according to the second embodiment. In FIG. 6, in Step 601, the data length-A compression unit 501 reads the data to be compressed. Next, in Step 602, the data length-A compression unit 501 compresses the input data by every predetermined data length A using a predetermined compression algorithm. In Step 603, the data length-A compression unit 501 calculates the compression rate based on the compression of the input data in Step 602.

In Step 604, the compression rate determination unit 503 determines whether the compression rate calculated in Step 603 is smaller than a predetermined threshold (compression rate is good). When it is larger than the predetermined threshold (poor as a compression rate) (604: NO), the flow proceeds to Step 606. In Step 606, the data length-B compression unit 502 compresses each predetermined data length B shorter than the data length A used in Step 602 by the same compression algorithm as used in Step 602. Further, in Step 607, the data selection unit 504 outputs the data compressed in Step 606.

In Step 604, when the compression rate calculated in Step 603 is smaller than the predetermined threshold (good as a compression rate) (604: YES), the flow proceeds to Step 605. In Step 605, the data selection unit 504 outputs the data compressed for each data length A.

In the above data compression method, if the compression rate is good when compressed with the long data length A (small as a numerical value), the decompression time is shortened by the good compression rate when decompressed. Therefore, the result compressed with the data length A is employed. On the other hand, if the compression rate is poor (large as a numerical value) when compressed with the long data length A, the result of compression with the short data length B is employed. This makes it possible to avoid an extra increase in decompression time caused by compressing a long data length with a poor (large as a numerical value) compression rate.

As described above, in the first compression method in the data compression system, the data is compressed for each predetermined first data length (data length A) by a preset compression algorithm. In the second compression method, the data is compressed for each preset second data length (data length B) shorter than the first data length by the same compression algorithm. Further, the decompression unit (not illustrated) of the compressed data can decompress each compressed segment and restore the original segment by the same method regardless of the compressed data length (data length A or data length B).

Third Embodiment

Figure 7:
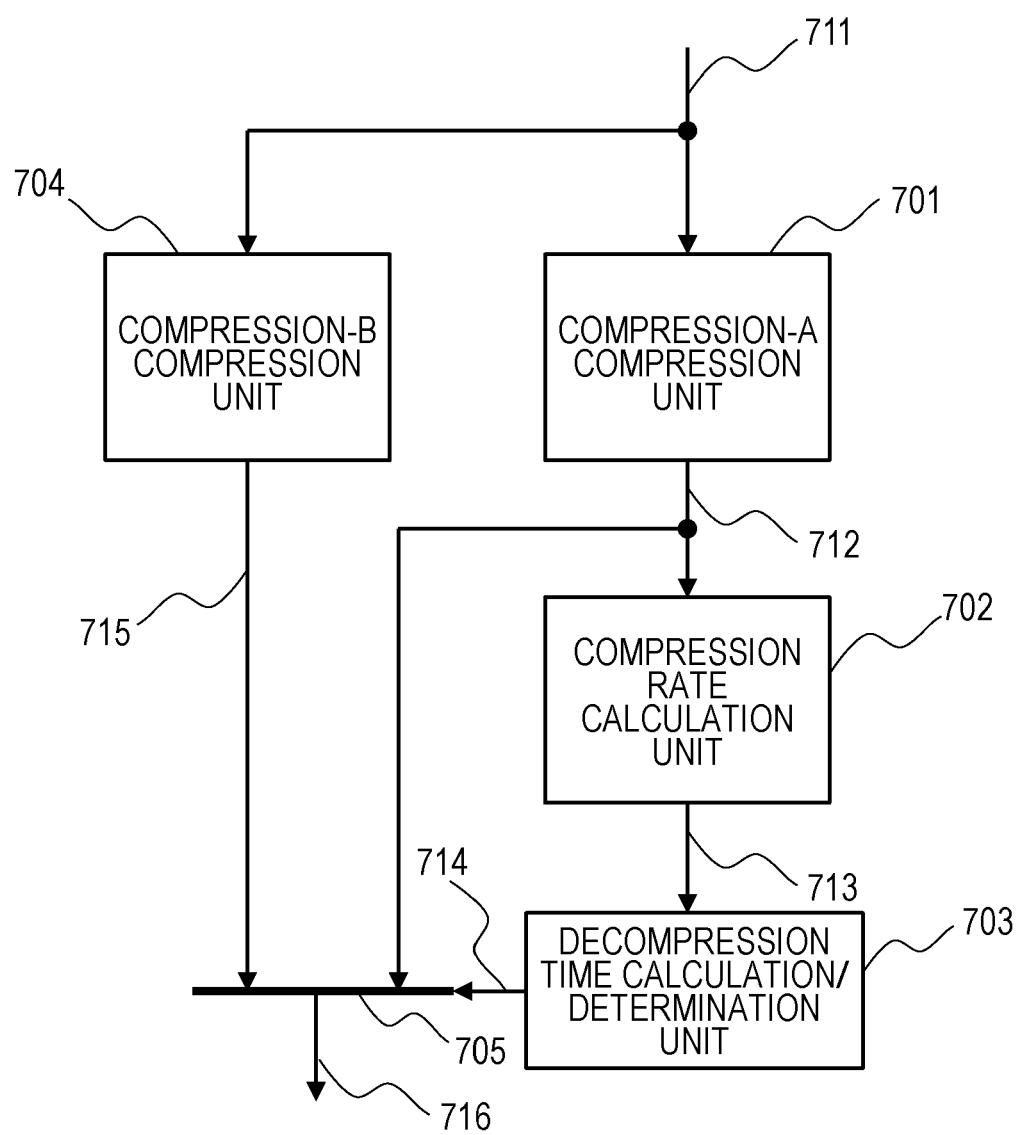
FIG. 7 is an example of a data compression system that compresses data according to a third embodiment.

Next, a third embodiment will be described with reference to FIGS. 7 and 8. FIG. 7 is an example of the configuration of the data compression system according to the third embodiment. In FIG. 7, the data compression system includes a compression-a compression unit 701, a compression-b compression unit 704, a compression rate calculation unit 702, a decompression time calculation/determination unit 703, a data selection unit 705, and six types of signal lines 711 to 716. The compression-a compression unit 701 and the compression-b compression unit 704 are included in the compression part of the data compression system, the compression rate calculation unit 702 and the decompression time calculation/determination unit 703 are included in the determination part of the data compression system, and the data selection unit 705 is an output part of the data compression system for outputting data.

The compression-a compression unit 701 compresses data using a predetermined compression algorithm a. The compression-b compression unit 704 compresses data using a predetermined compression algorithm b which is known to have a compression rate worse (larger as a numerical value) than that of the compression algorithm a and a shorter decompression time than that of the compression algorithm a. The compression rate calculation unit 702 receives the compression result of the compression-a compression unit 701 and calculates the compression rate. The decompression time calculation/determination unit 703 calculates the decompression time based on the compression rate calculated by the compression rate calculation unit 702, and determines whether it is longer or shorter than a predetermined threshold (reference time). The data selection unit 705 selects the compressed data to be output.

The compression-a compression unit 701 compresses the data input by the input signal line 711 by a predetermined compression algorithm a, and outputs the compressed data resulting from the compression to the output signal line 712. The compression rate calculation unit 702 receives the compressed data output to the signal line 712 and calculates the compression rate. The result of calculating the compression rate is transmitted to the decompression time calculation/determination unit 703 via the signal line 713.

Calculation of the compression rate requires the size of the original input data. For example, the compression unit 701 may transmit the size of the original input data to the compression rate calculation unit 702 using another signal line not illustrated in FIG. 7, or using the same signal line 712 as the compressed data. Alternatively, the compression-a compression unit 701 may divide the input data by a predetermined data length and compress each divided part of the input data, and the compression rate calculation unit 702 may use the predetermined data length to calculate the compression rate. Or, the compression rate calculation unit 702 may receive the compressed data itself in order to calculate the compression rate. Since it is sufficient to know the size of the compressed data in order to calculate the compression rate, the compression-a compression unit 701 may extract the size information of the compressed data, transmit only the size information of the extracted compressed data to the compression rate calculation unit 702, and not transmit the compressed data itself.

The compression-b compression unit 704 compresses the data input to the signal line 711 using a predetermined compression algorithm b which is known to have a compression rate worse (larger as a numerical value) than that of the compression algorithm a and a shorter decompression time than that of the compression algorithm a.

The decompression time calculation/determination unit 703 receives the compression rate information calculated in the compression rate calculation unit 702 via the signal line 713, and calculates the decompression time of the data compressed by the compression-a compression unit 701 based on the received compression rate information. Then, the calculated decompression time of the data is compared with a predetermined threshold.

When the calculated decompression time is shorter than the predetermined threshold, the decompression time calculation/determination unit 703 outputs a data select signal to the data selection unit 705 through the signal line 714 to select the compressed data from the compression-a compression unit 701. When the calculated decompression time is longer than or equal to the predetermined threshold, the decompression time calculation/determination unit 703 outputs a data select signal to the data selection unit 705 through the signal line 714 to select the compressed data from the compression-b compression unit 704.

The data selection unit 705 selects between the compressed data compressed from the compression-a compression unit 701 and the compressed data compressed from the compression-b compression unit 704 according to the data select signal input through the signal line 714 from the decompression time calculation/determination unit 703, and outputs the compressed data to the output signal line 716.

As described above, in the data compression system of this embodiment, the first compression method compresses the data by the compression algorithm a, and the second compression method compresses the data by the compression algorithm b. The compression algorithm b has a compression rate worse than that of the compression algorithm a, and the decompression time is shorter than the decompression time of the compressed data by the compression algorithm a. Further, the data compression system estimates the decompression time based on the compression rate and compares the decompression time with a threshold to determine whether the compression rate exceeds a predetermined reference.

In the above, the signal lines 711, 712, 714, and 716 may be serial transmission lines or parallel transmission lines, like the signal lines 111 and 112 in FIG. 1 of the first embodiment. The control signal for signal transmission control may be transmitted through a sideband control signal line (not illustrated in FIG. 7), or the data and the control signal may be transmitted through the same signal line.

Further, the data may be transmitted by multiple packets, or the signal line may be occupied at a constant timing to arbitrarily transmit the data. The signal line 713 for transmitting the compression rate information by the compression rate calculation unit 702 may be a serial transmission line or a parallel transmission line like the signal line 113 of FIG. 1 in the first embodiment. Alternatively, an analog signal transmitted at a voltage level or the like may be used instead of the digital signal. Further, while not illustrated in FIG. 7, a sideband signal line related to signal transmission control may be provided, or the same signal line may be used to transmit the compression rate information and the control signal.

Further, the signal line 714 for transmitting the data select signal may present the selection result at a voltage level like the select signal line 115 of FIG. 1 of the first embodiment, or may present the selection result as a pulsed signal at a constant timing. Further, using a control line (not illustrated in FIG. 7), the decompression time calculation/determination unit 703 may instruct the data selection unit 705 with a timing of selecting the compressed data and a timing of outputting the compressed data to the signal line 716. A signal for controlling the timing of selecting the compressed data or the timing of outputting the compressed data may be generated inside the data selection unit 705.

As described above, the compression rate calculation unit 702 calculates the compression rate using the result of the compression—a compression unit 701 compressing with the compression algorithm a. Further, based on the calculation result of the compression rate, the decompression time calculation/determination unit 703 calculates and determines the decompression time. This makes it possible to confirm that the decompression time is shorter than a predetermined threshold when decompressing the result compressed by the compression algorithm a before outputting the compressed data of the result compressed by the compression-a compression unit 701.

Further, when the compression-a compression unit 701 compresses with the compression algorithm a and it is found that the decompression time is equal to or longer than the predetermined threshold, the compression system employs the result compressed by the compression-b compression unit 704 which compresses data by the compression algorithm b in which the decompression time is known to be shorter than that when compressed by the compression algorithm a. This makes it possible to avoid an extra increase in decompression time.

Further, whether the compression result by the compression algorithm a or the compression result by the compression algorithm b is determined only by the compression rate of the result of compression by the compression algorithm a and the decompression time based thereon. It is known that the compression algorithm b has a compression rate worse (larger as a numerical value) than that of the compression algorithm a and a shorter decompression time than that of the compression algorithm a, so there is no need to obtain the compression rate and the decompression time of the compression algorithm b to determine which compression algorithm is used.

Figure 8:
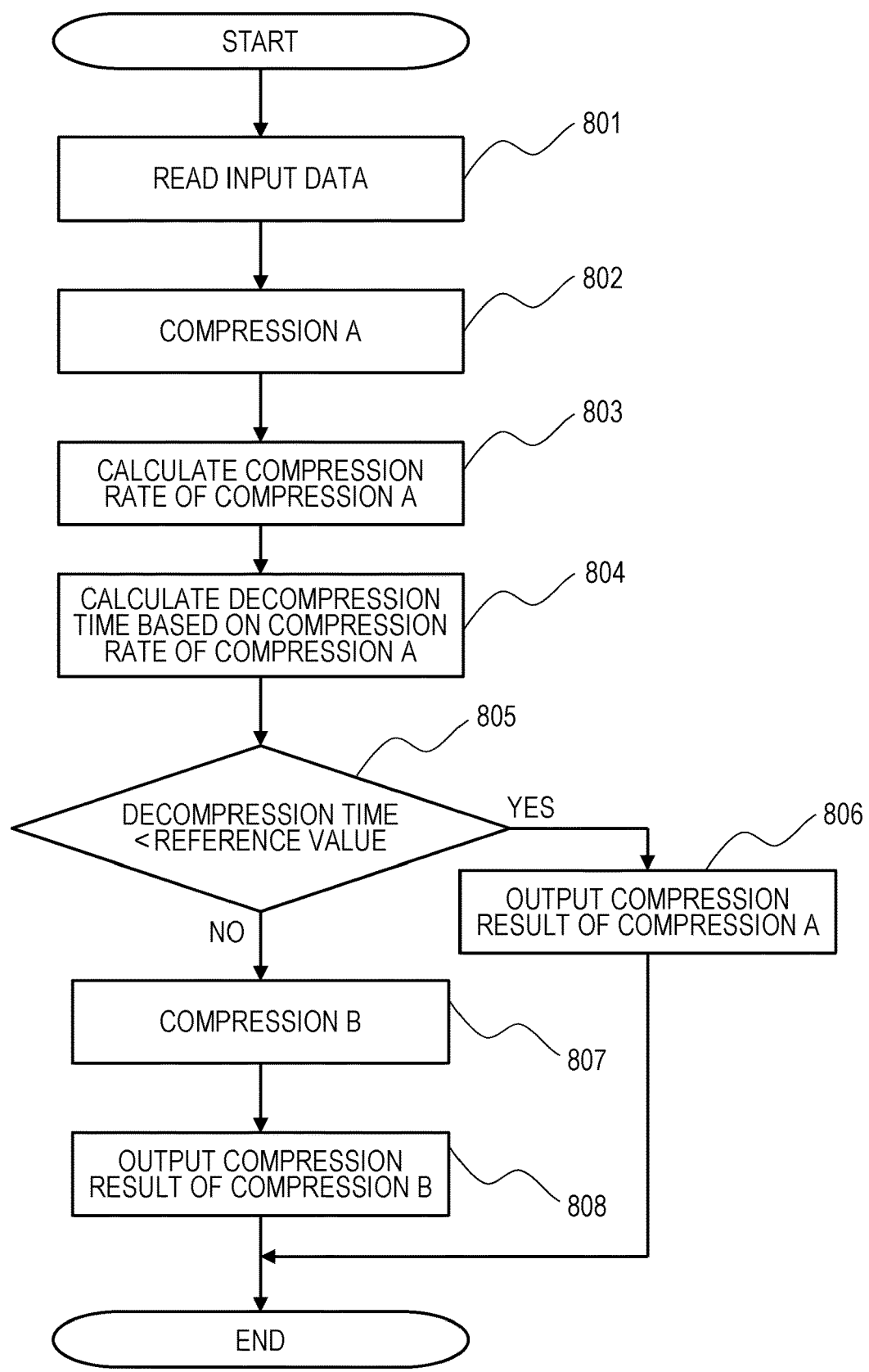
FIG. 8 is an example of a flowchart for compressing data according to the third embodiment.

FIG. 8 illustrates a flowchart of a method for compressing data according to the third embodiment. In FIG. 8, in Step 801, the compression-a compression unit 701 reads the data to be compressed. Next, in Step 802, the compression-a compression unit 701 compresses using the predetermined compression algorithm a. In Step 803, the compression rate calculation unit 702 calculates the compression rate based on the compression of the input data with the compression algorithm a in Step 802. In Step 804, the decompression time calculation/determination unit 703 calculates the time required for decompression using the compression rate based on the compression of the input data calculated in Step 803 with the compression algorithm a.

In Step 805, the decompression time calculation/determination unit 703 determines whether the decompression time calculated in Step 804 is shorter than a predetermined threshold. When it is shorter than the predetermined threshold (805: YES), the flow proceeds to Step 806. In Step 806, the data selection unit 705 outputs the data compressed by the compression-a compression unit 701 in Step 802.

In Step 805, when the decompression time calculated in Step 804 is longer than or equal to the predetermined threshold (805: NO), the flow proceeds to Step 807. The compression-b compression unit 704 compresses the input data read in Step 801 with the predetermined compression algorithm b that has a compression rate worse (larger as a numerical value) than that of the algorithm a used in Step 802 and a shorter decompression time than that of the algorithm a. In Step 808, the data selection unit 705 outputs the data compressed by the compression-b compression unit 704 in Step 807.

In the data compression method as described above, the compression rate is calculated in Step 803 based on the result of compression by the compression algorithm a in Step 802, and the decompression time is calculated in Step 804 using the calculation result of the compression rate to make a determination. Thus, when the result compressed by the compression algorithm a is decompressed, it is possible to confirm that the decompression time is shorter than the predetermined threshold before outputting the compressed data of the compressed result.

Further, in the above compression method, when the decompression time of the result of compression by the compression algorithm a in Step 802 is calculated and it is found that the decompression time is longer than the predetermined threshold, the result of compression by the compression algorithm b, which is known to have a shorter decompression time than that of compression by the compression algorithm a, is adopted in Step 807. This makes it possible to avoid an extra increase in decompression time.

Fourth Embodiment

Figure 9:
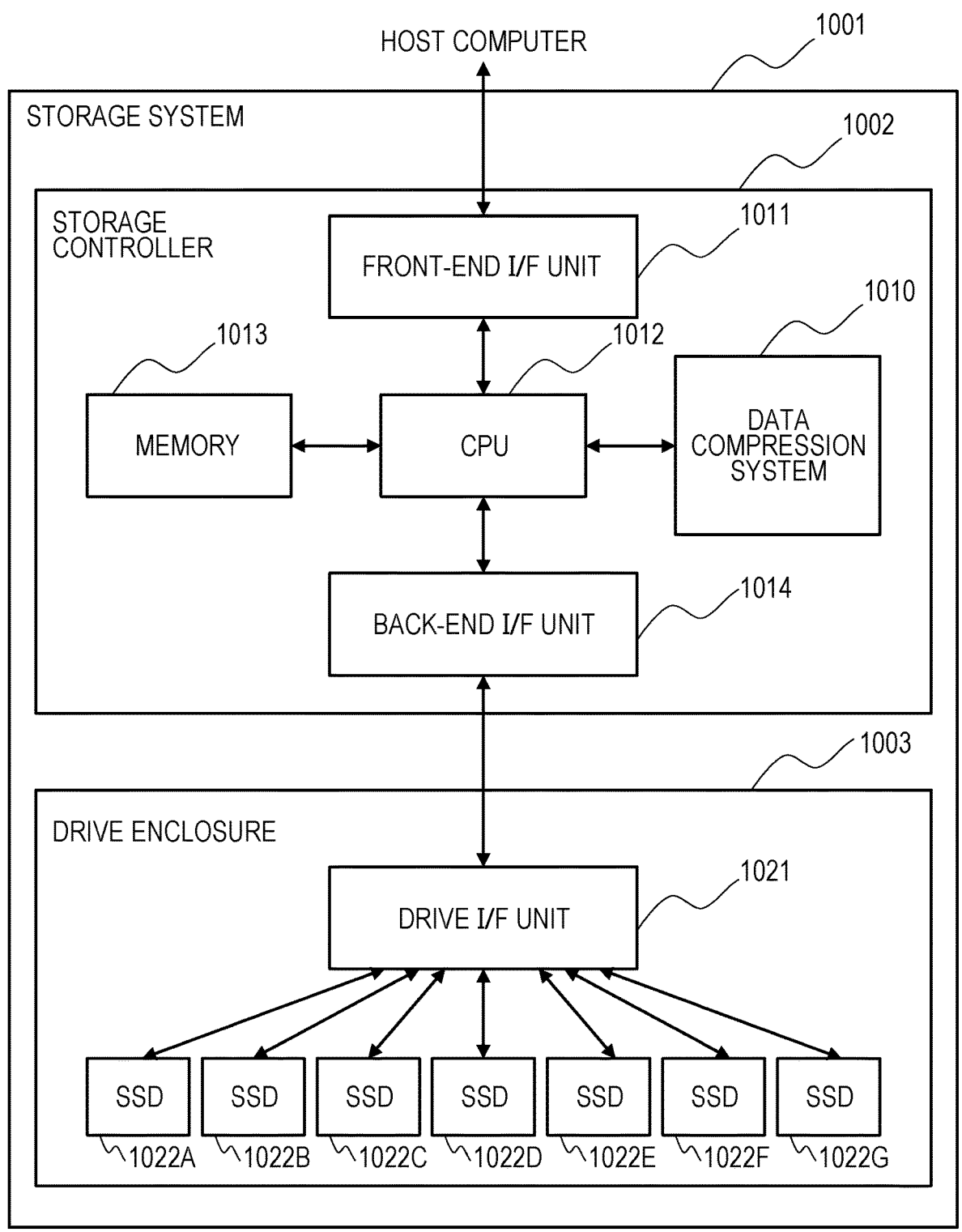
FIG. 9 is an example of the overall configuration of a storage system to which a data compression system is applied.

FIG. 9 is an example of the overall configuration of a storage system to which the data compression system according to the above embodiments is applied. In FIG. 9, a storage system 1001 includes a storage controller 1002 that performs data transfer and data processing, and a drive enclosure (drive box) 1003. The storage controller 1002 includes a front-end interface (I/F) unit 1011, a CPU 1012, a back-end I/F unit 1014, and a data compression system 1010 according to the above-described embodiments. In the configuration example of FIG. 9, the data compression system 1010 is installed in the storage controller 1002.

The front-end I/F unit 1011 receives a request to the storage system 1001 from a host computer (not illustrated) and sends the result. The CPU 1012 controls the entire storage system 1001. The back-end I/F unit 1014 is connected to the drive enclosure 1003.

The drive enclosure 1003 includes a drive I/F unit 1021 connected to the storage controller 1002, non-volatile semiconductor storage devices SSDs (Solid State Drive) 1022A to 1022G, and an enclosure structure for housing these. The SSD is an example of a storage device installed in the drive enclosure 1003.

FIG. 9 illustrates seven SSDs 1022A to 1022G, but the number of SSDs is not limited to seven and may be any number. FIG. 9 illustrates only one drive I/F unit 1021, but two drive I/F units may be installed and each of the SSDs 1022A to 1022G having two ports may be connected to each of the two drive I/F units. Further, two or more drive enclosures 1003 may be provided.

The number of storage controllers 1002 is not limited to one and may be two or more. The number of each internal component of the storage controller 1002 is not limited to one as illustrated in FIG. 9, and each of them may be installed with two or more front-end I/F units 1011, CPUs 1012, memories 1013, back-end I/F units 1014, and data compression systems 1010.

Further, although FIG. 9 illustrates the storage controller 1002 and the drive enclosure 1003 separately, they may not be provided separately. In this case, when a plurality of drive enclosures 1003 are used, at most one drive enclosure 1003 and one storage controller 1002 are combined and the remaining drive enclosure 1003 may be connected to the storage controller 1002 in the same manner as the configuration illustrated in FIG. 9.

The data compression system 1010 may acquire the compressed data from the memory 1013 via the CPU 1012 and store the decompressed data in the memory 1013. Alternatively, the data compression system 1010 may directly receive and compress the data received from the host computer via the front-end I/F unit 1011 without storing it in the memory 1013.

The data compression system 1010 may directly store the compressed data in the SSDs 1022A to 1022G without storing the compressed data in the memory 1013 through the back-end I/F unit 1014, or may directly read and decompress the compressed data from the SSD 1022 without storing the data in the memory 1013. The data compression system 1010 may directly send the decompressed data to the host computer through the front-end I/F unit 1011 without storing the data in the memory 1013.

Figure 10:
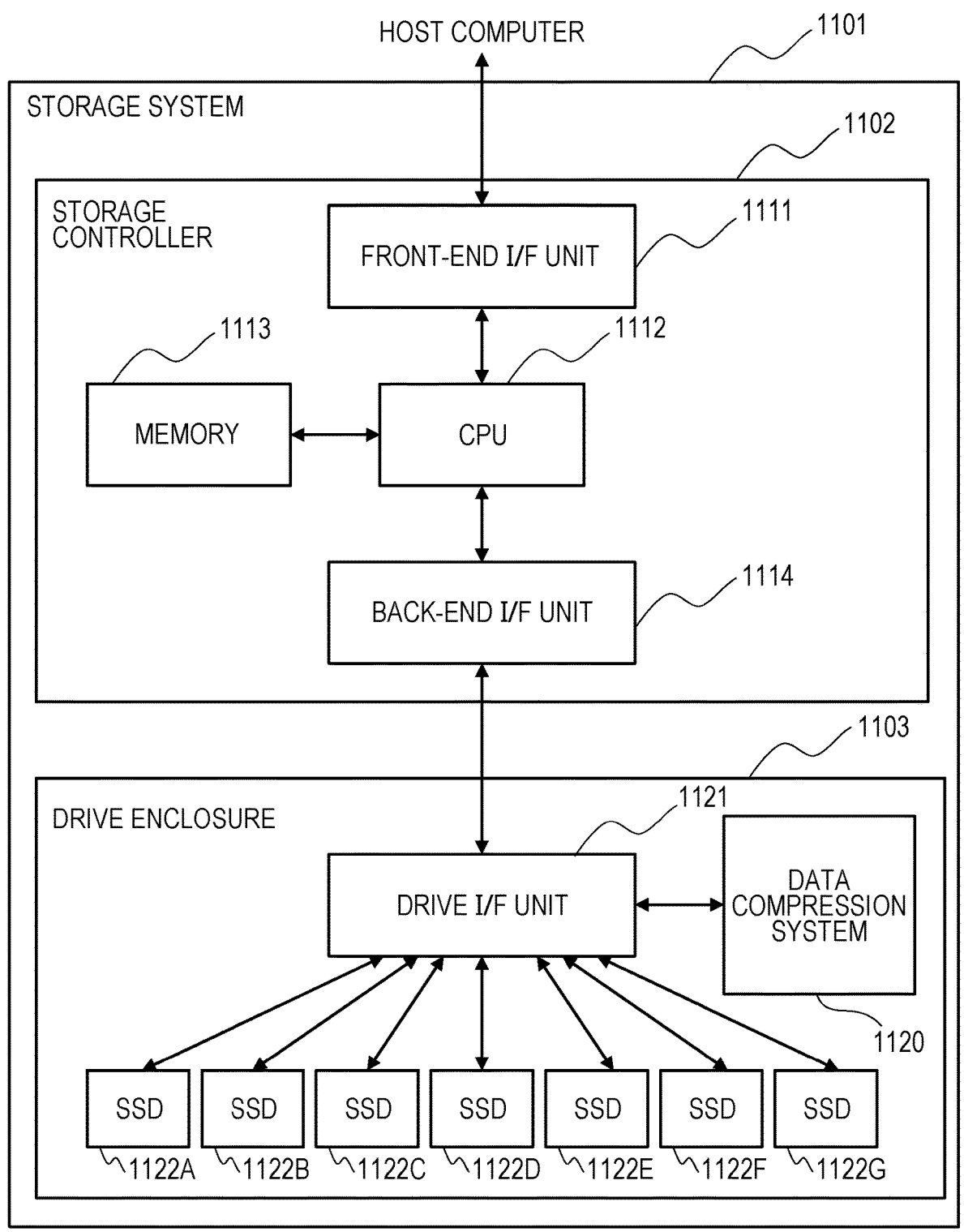
FIG. 10 is another example of the overall configuration of a storage system to which the data compression system is applied.

FIG. 10 is another example of the overall configuration of the storage system to which the data compression system according to the above embodiment is applied. In FIG. 10, a data compression system 1120 is inside a drive enclosure 1103 not in a storage controller 1102. That is, the storage controller 1102 includes a front-end I/F unit 1111, a CPU 1112, a memory 1113, and a back-end I/F unit 1114. The drive enclosure 1103 includes a drive I/F unit 1121, a data compression system 1120, SSDs 1122A to 1122G, and an enclosure structure that houses these.

In the configuration illustrated in FIG. 10, the storage controller 1102, the drive enclosure 1103, the front-end I/F unit 1111, the CPU 1112, the memory 1113, the back-end I/F unit 1114, the drive I/F unit 1121, and the data compression system 1120 are illustrated as only one of each, and the SSDs 1122A to 1122G are illustrated as only seven of them. However, the number of each component is not limited, and is arbitrary as in the configuration illustrated in FIG. 9. Further, the storage controller 1102 and the drive enclosure 1103 do not have to be particularly separated and may be combined, as in the configuration example of FIG. 9.

In the configuration in which the data compression system 1120 is installed inside the drive enclosure 1103 as illustrated in FIG. 10, the data received from the host computer is transferred through the drive I/F unit 1121 directly to the data compression system 1120 after the storage controller 1102 performs a predetermined process. The data compression system 1120 compresses the data and then directly stores the data in the SSDs 1122A to 1122G.

Further, when decompressing the compressed data which is the data compressed and stored in the SSDs 1122A to 1122G, the data compression system 1120 receives the compressed data from the SSDs 1122A to 1122G without sending the compressed data from the SSDs 1122A to 1122G to the storage controller 1102 once. After the data compression system 1120 decompresses the compressed data, the decompressed data is directly transferred from the data compression system 1120 to the storage controller 1102 through the drive I/F unit 1121.

Further, the invention is not limited to the embodiments described above, but includes various modifications. For example, the above-described embodiments have been described in detail in a clearly understandable way, and are not necessarily limited to those having all the described configurations. In addition, some of the configurations of a certain embodiment may be replaced with the configurations of the other embodiments, and the configurations of the other embodiments may be added to the configurations of the subject embodiment. It is possible to add, delete, and replace other configurations for a part of the configuration of each embodiment.

In addition, some or all of the configurations, functions, and processing units may be realized in hardware such as an integrated circuit. In addition, the configurations and the functions may be realized in software such that a processor interprets and performs a program which realizes each function. The information of programs, tables, files to realize the functions may be stored in a memory, a recording device such as a hard disk, an SSD (Solid State Drive), or a recording medium such as an IC card and an SD card.

In addition, the control lines and the information lines are illustrated which are considered as necessary for explanation, and it does not mean that all the control lines and the information lines are necessarily illustrated for a product. In practice, almost all the configurations may be connected to each other.

What is claimed is:

1. A storage system, comprising:
one or a plurality of front-end interfaces that communicates with a host; and
a data compression system that compresses data received by the front-end interfaces from the host before storing the data in a storage device, wherein the data compression system is configured to compress the data with a first compression method to generate compressed data, determine whether a compression rate of the compressed data by the first compression method is better than a predetermined reference, output data obtained by compressing the data with the compression method having a better compression rate than that of the other compression method of the first compression method and a second compression method when it is determined that the compression rate of the compressed data by the first compression method is better than the reference, and
output data obtained by compressing the data by the compression method having a worse compression rate than that of the other compression method of the first compression method and the second compression method when it is determined that the compression rate of the compressed data by the first compression method is equal to or worse than the reference.

2. The storage system according to claim 1, wherein the first compression method compresses data by a first compression algorithm, and the second compression method compresses data by a second compression algorithm after compressing the data by the first compression algorithm.

3. The storage system according to claim 1, wherein
the data compression system is further configured to assign the compressed data with identification information for identifying which of the first compression method and the second compression method outputs the compressed data, and decompress the compressed data by a decompression method corresponding to either one of the first compression method and the second compression method based on the identification information assigned to the compressed data when the compressed data is decompressed.

4. The storage system according to claim 1, wherein
the first compression method compresses the data for each predetermined first data length by a predetermined compression algorithm, and
the second compression method compresses the data for each predetermined second data length shorter than the first data length by the predetermined compression algorithm.

5. The storage system according to claim 1, wherein a compression algorithm of the second compression method has a compression rate worse than the compression rate of the compression algorithm of the first compression method, and has a decompression time shorter than the decompression time of the compressed data by the compression algorithm of the first compression method.

6. The storage system according to claim 1, wherein the data compression system is configured to compare a compression rate of the compressed data by the first compression method with a predetermined threshold, determine that the compression rate is better than the reference when the compression rate is better than the threshold, and determine that the compression rate is equal to or worse than the reference when the compression rate is equal to or worse than the threshold.

7. The storage system according to claim 1, wherein the data compression system is configured to calculate a decompression time of the compressed data by a predetermined calculation method from the compression rate of the compressed data by the first compression method, compare the decompression time with a predetermined threshold, determine that the compression rate is better than the reference when the decompression time is shorter than the threshold, and determine that the compression rate is equal to or worse than the reference when the decompression time is equal to or longer than the threshold.

8. The storage system according to claim 1, comprising:
one or a plurality of storage devices; and
one or a plurality of storage controllers that performs data transfer and data processing between the host and the storage devices, wherein the front-end interfaces and the data compression system are included in the storage controllers.

9. The storage system according to claim 1, comprising:
one or a plurality of drive enclosures that includes a plurality of storage devices; and
one or a plurality of storage controllers that include the front-end interfaces and performs data transfer and data processing between the host and the drive enclosures, wherein
the data compression system is included in the drive enclosures.

10. A data compression system, comprising:
a compression unit that is capable of compressing data by a first compression method and a second compression method;
a determination unit that determines whether a compression rate of the data compressed by the first compression method is better than a predetermined reference; and
an output unit that outputs the data compressed by the compression unit, wherein
the output unit outputs data obtained by compressing the data with the compression method having a better compression rate than that of the other compression method of the first compression method and a second compression method when the determination unit determines that the compression rate of the compressed data by the first compression method is better than the reference, and
the output unit outputs data obtained by compressing the data by the compression method having a worse compression rate than that of the other compression method of the first compression method and the second compression method when the determination unit determines whether the compression rate of the data compressed by the first compression method is equal to or worse than the reference,
wherein a compression algorithm of the second compression method has a compression rate worse than the compression rate of the compression algorithm of the first compression method, and has a decompression time shorter than the decompression time of the compressed data by the compression algorithm of the first compression method.

11. A method for compressing data in a storage system, comprising:
compressing the data with a first compression method to generate compressed data;
determining whether a compression rate of the compressed data compressed by the first compression method is better than a predetermined reference;
outputting data obtained by compressing the data by the compression method having a better compression rate than that of the other compression method of the first compression method and a second compression method when it is determined that the compression rate of the compressed data compressed by the first compression method is better than the reference; and
outputting data obtained by compressing the data by the compression method having a worse compression rate than that of the other compression method of the first compression method and the second compression method when it is determined that the compression rate of the compressed data compressed by the first compression method is equal to or worse than the reference.

* * * * *